United States Patent [19]
Gorisse

[11] Patent Number: 5,349,622
[45] Date of Patent: Sep. 20, 1994

[54] PROGRAMMABLE FREQUENCY DIVIDER CIRCUIT

[75] Inventor: Philippe Gorisse, Caen, France

[73] Assignee: U.S. Philips Corporation, New York, N.Y.

[21] Appl. No.: 896,081

[22] Filed: Jun. 8, 1992

[30] Foreign Application Priority Data

Jun. 7, 1991 [FR]  France ................................. 91 06928

[51] Int. Cl.$^5$ ............................................ H03K 23/66
[52] U.S. Cl. ......................................... 377/52; 377/48; 377/50
[58] Field of Search ................................. 377/48, 50, 52

[56] References Cited

U.S. PATENT DOCUMENTS

| | | | |
|---|---|---|---|
| 4,468,797 | 8/1984 | Shin | 377/52 |
| 4,573,176 | 11/1993 | Yeager | 377/48 |
| 5,065,415 | 11/1991 | Yamashita | 377/52 |

FOREIGN PATENT DOCUMENTS 401303927 12/1989 Japan ..................................... 377/48

*Primary Examiner*—Margaret Rose Wambach
*Attorney, Agent, or Firm*—Steven R. Biren

[57] ABSTRACT

A programmable frequency divider circuit includes a prescaler which consists of p cascade-connected dividing cells, a cell of rank i in the cascade having a normal division factor 2 and also being programmable so as to divide by 3 the input frequency applied to the cell. Each cell of rank i supplies, as a signal enabling the programmed mode for the preceding cell of rank i-1, a signal which is referred to as a gating signal and which is calibrated as regards duration and position in time at the operating frequency of the cell i, the prescaler (PPSC) being associated with counting means (CNT) for producing a programmable division factor (R) which is equal to $M.2^p + N$, where M is an integer number applied to the counting means (CNT), p is the number of cells of the prescaler (PPSC), and N is an integer number applied to the programming inputs of the prescaler (PPSC).

7 Claims, 3 Drawing Sheets

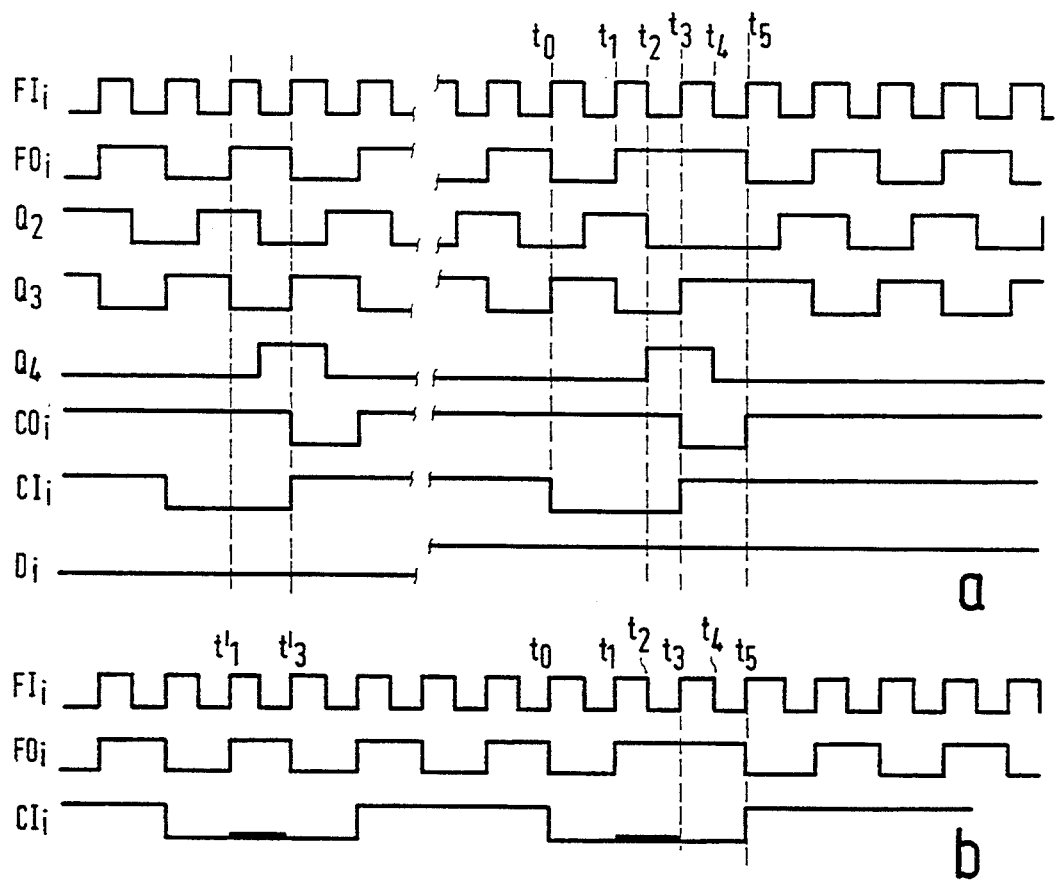
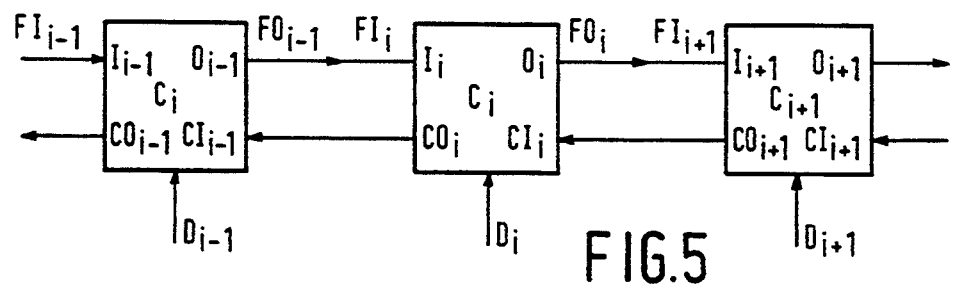
FIG.4
FIG.5
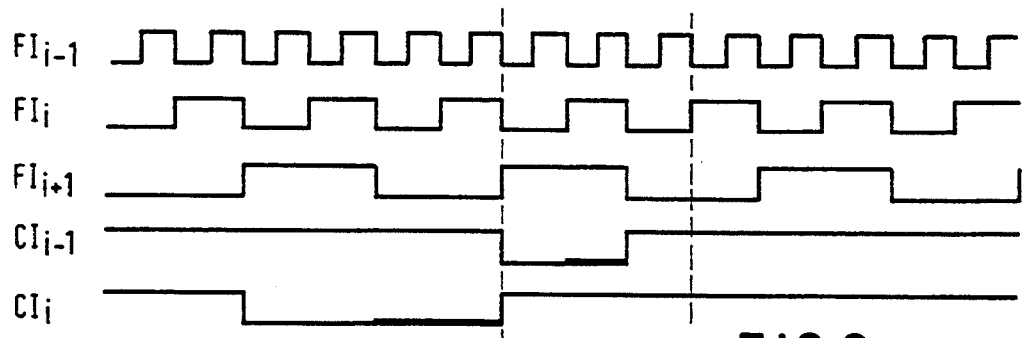
FIG.6

PROGRAMMABLE FREQUENCY DIVIDER CIRCUIT

BACKGROUND OF THE INVENTION

The invention relates to a programmable frequency divider circuit, comprising:

p cascade-connected frequency dividing cells, a cell of rank i in the cascade performing an $i^{th}$ division, where i takes one of the values from 0 to (p-1), all cells being switchable between a divide-by-two mode, referred to as the normal mode, and a divide-by-three mode, referred to as the programmed mode, a cell having of arbitrary rank i comprising a first input ($I_i$) for an input frequency signal ($FI_i$) and a first output ($O_i$) for an output frequency signal ($FO_i$) to be applied to the first input ($I_{i+1}$) of the next cell of rank (i+1), a second input ($CI_i$) for an enable signal for the programmed mode, a third input ($D_i$) for a programming signal, and a second output ($CO_i$) for a gating signal, there being provided means for generating said gating signal from the enable signal received on the second input ($CI_i$) of the cell i, said gating signal being applied to the second input ($CI_{i-1}$) of the cell (i−1) of lower rank as an enable signal.

A prior art frequency divider circuit of this kind is known from the document FR-A-2 653 617. According to the cited document, the programmable frequency divider circuit comprises a plurality of p cascade-connected dividing cells, each of which is capable of performing a division of the input frequency of the cell by two or by three, depending on the value of signals applied on the one hand to the third input, referred to as the programming input ($D_i$), and on the other hand to the second input ($CI_i$) which is referred to as the enable input of the relevant cell. For a given division factor, appropriate signals are permanently applied to the programming inputs ($D_i$), whereas an enable signal received on the second input ($CI_i$) of each cell determines the instant at which the relevant cell must execute the division mode which is referred to as the programmed mode, i.e. a division by three instead of two in the normal mode. Each cell receiving an enable signal supplies the preceding cell with a signal which is referred to as a gating signal and which is received by said preceding cell as an enable signal.

The known frequency divider circuit has a given number of limitations. On the one hand, the range of division factor values to be utilized by such a circuit is rather limited (it depends on the number of cells), because the enable signal applied to the $p^{th}$ cell, i.e. the last one of the series, is actually an invariable signal and more specifically a low signal. The corresponding enable input is actually connected to ground. On the other hand, in the known circuit each dividing cell produces a gating signal intended for the preceding cell and fixed by the rhythm of that cell itself in as far as it concerns the transition to the active logic state of said gating signal, whilst the returning to the inactive logic state of this gating signal is applied directly to all cells simultaneously under the influence of an OR-gate provided in each cell of this circuit. This signal necessarily incurs a delay while progressing through the p cells of the circuit, whereas a high precision is necessary in as far as it concerns the first cell which operates at the highest frequency.

It is an object of the present invention to eliminate said limitations.

SUMMARY OF THE INVENTION

To achieve this, a frequency divider circuit in accordance with the invention is characterized in that the means for generating the gating signal are operative so that this signal is supplied as from the instant at which the enable signal received by the relevant cell i returns to its inactive logic state, in that with the p cells which constitute a prescaler for the frequency divider circuit there are associated counting means for performing a first counting operation and a second counting operation, for a first number and a second number, respectively, of periods of the output frequency of said prescaler, the second input ($CI_{p-1}$) of the $p^{th}$ cell receiving an enable signal which is supplied by the counting means and which is derived from the completion of said first counting operation, the completion of said first and second counting operations constituting an output period of the divider circuit. In the frequency divider circuits, the term "swallowing" of a period of the input frequency is used to denote the operation which results from the fact that a cell, when programmed and controlled to divide by 3, "swallows" without reaction a supplementary period of its input frequency in comparison with the normal mode (non-programmed mode) in which it divides its input frequency by 2.

Because in the divider circuit in accordance with the invention a prescaler consisting of p cascade-connected programmable dividing cells is associated with counting means enabling a programmable increase of the division factor obtained on the output of the prescaler, the circuit in accordance with the invention has a range of division factors which is wider than that of the known circuit. Moreover, the gating signal generated by an arbitrary cell of the prescaler is generated only when its own enable signal returns to its inactive logic state or slightly thereafter. Therefore, the enable signal received by an arbitrary cell of rank i will be defined at the beginning of its active logic state as well as upon its return to the inactive logic state by the subsequent cell, so that this signal has the precision of the cell having the rank i+1. This offers the major advantage that while proceeding through the series of p cascade-connected cells from the last cell to the first cell, the precision necessary for the gating signals (which are at the same time the enable signals received by the neighboring cell) does not necessitate a timing precision which is higher than the precision required within the relevant cell operating at its own input frequency. In other words, the gating signals are recalibrated to a increasingly more precise time scale while progressing from the last cell to the first cell of the prescaler.

Actually, the swallow enable signal supplied by the counting means has a comparatively low frequency which corresponds to the output frequency of the prescaler, so that this link is not critical. The gating signals supplied by each cell so as to serve as an enable signal for the preceding cell has a frequency which increases while proceeding from the $p^{th}$ cell to the second cell. The most critical link in respect of time response (for the enable command of the first cell), therefore, is situated between the second and the first cell, which cells are inherently arranged one adjacent the other and can be fed with the largest currents. The subsequent cells, operating at increasingly lower frequencies, may be fed with increasingly smaller currents. Therefore, the frequency divider circuit in accordance with the invention is capable of receiving a signal having an input frequency which is higher than that in the prior art.

Moreover, the circuit in accordance with the invention is also easier to implement and does not comprise any connections which are very long as well as critical in respect of time response, as is the case in the known circuit where a critical connection must control the input cell of the prescaler as from the output cell thereof and through all other cells constituting the prescaler.

In a preferred embodiment of the invention, the divider circuit is characterized in that when said counting means are loaded with a total count M (where M is an integer variable greater than 1) said first number is equal to (M−1), and in that during the counting of said first number the p cells of the prescaler operate in the non-programmed mode and the programming inputs may be reloaded while said second number is equal to 1, corresponding to a period of the output frequency of the prescaler whose cells then operate in the programmed mode, said counting means being reloaded to the count M during the latter period. In this embodiment the counting means can be readily reduced to a single counter, thus reducing the complexity and magnitude of the divider circuit.

The gating signal generated by a cell of rank i preferably has a duration of between 0.5 and 1.5 times the period of the input frequency ($FI_i$) of the relevant cell.

In a practical and attractive embodiment of the invention, the divider circuit is characterized in that each of the cells of the prescaler comprises a first and a second D-type flipflop, which flipflops are cascade-connected in and are clocked by the input frequency signal ($FI_i$) of the relevant cell and its logic inverse, respectively, in that the output of the second flipflop is fed back to the data input of the first flipflop, the output of the first flipflop constituting the first output ($O_i$) of the cell, and in that it comprises a hold stage between the output of the second flip flop and the data input of the first flipflop, which stage includes said programming input ($D_i$) of the cell and is operative to impose the state of the data input (D) of the first flipflop for swallowing a period of the input frequency signal when the swallow programming signal ($D_i$) and the enable signal ($CI_i$) are simultaneously active.

The swallowing of a period of the input frequency of an arbitrary cell can be achieved because of the fact that the hold stage comprises a third D-type flipflop which is clocked by the input frequency signal ($FI_i$) and whose data input reverse receives the logic inverse of the output signal of the second flipflop, its output being connected to a first inverting OR-gate, the second input of said OR-gate constituting said second input ($CI_i$) of the cell, the output of said OR-gate being connected to the data input of a fourth D-type flipflop which is clocked by the inverse of the input frequency signal ($FI_i$) and whose output is fed back to the input of the first flipflop because this output is connected to a first input of an AND-gate whose other input constitutes said programming input ($D_i$) of the cell, the output of the AND-gate being connected to a first input of a second OR-gate whose output is connected to the input of the first flipflop, the second input of the second OR-gate receiving the output signal of the second flipflop in order to realise said feedback from said output to the input of the first flipflop.

Preferably, each cell of the prescaler also comprises a fifth D-type flipflop which is clocked by the input frequency signal ($FI_i$) and whose data input receives the logic inverse of the output of the fourth flipflop, the output of the fifth flipflop constituting said second output ($CO_i$) of the cell.

BRIEF DESCRIPTION OF THE DRAWING

The invention will be described in detail hereinafter with reference to the accompanying drawing, in which FIG. 5 shows three adjoining cells, FIG. 6 shows corresponding timing diagrams.

DESCRIPTION OF THE PREFERRED EMBODIMENTS

Figure 1:
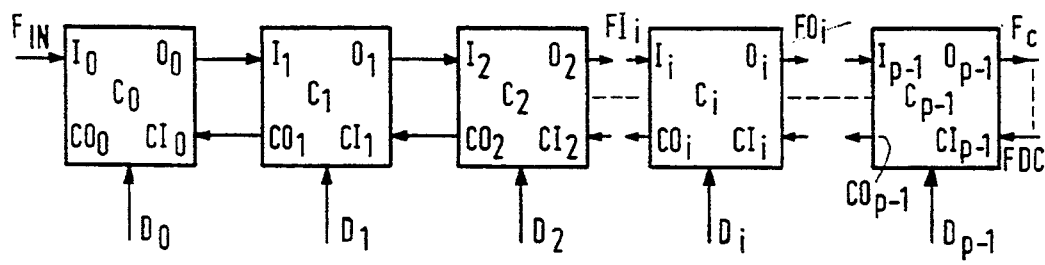
FIG. 1 shows a part of the frequency divider circuit in accordance with the invention.

FIG. 1 shows diagrammatically the configuration of a p-cell prescaler in the frequency divider circuit in accordance with the invention. In this Figure each cell is provided with an index which corresponds to its rank which extends from 0 for the input cell to (p−1), for the output cell of the prescaler. Each dividing cell (of rank i for an arbitrary cell) comprises an input $I_i$ for an input frequency signal $FI_i$ and an output $O_i$ for a signal of output frequency $FO_i$, as well as a programming input $D_i$. An input $CI_i$ serves to receive a swallow enable signal (signal also denoted as $CI_i$) for swallowing a supplementary period of the input frequency $FI_i$, said swallowing being performed when the programming input $D_i$ is 1 and being inhibited when the programming input $D_i$ is 0. The swallow programming signal itself is also denoted as $DO_i$ in the Figure. An output $CO_i$ produces a gating signal which serves as a swallow enable signal for the cell of rank (i−1) which precedes the relevant cell. The cell of rank zero ($C_o$), or the input cell, receives the frequency $F_{IN}$ to be divided on its input $I_o$. The output $O_o$ of the cell of rank zero is connected to the input $I_1$ of the cell of rank 1 and so on as far as the cell of rank (p−1) whose input $I_{p-1}$ receives the output signal $O_{p-2}$ of the cell of rank (p−2). The output $O_{p-1}$ of the output cell of the prescaler supplies a signal $F_c$. The input $CI_{p-1}$ of said output cell receives a swallow enable signal FDC which sets this cell to the programming mode for the duration of a single period of its output frequency. The output $CO_{p-1}$, connected to the input $CI_{p-2}$ of the cell of rank (p−2), subsequently produces a gating signal which is generated on the basis of the signal FDC; this procedure is repeated from one cell to the preceding cell until the cell of rank zero is reached, the input $CI_o$ of the latter cell receiving the output signal $CO_1$ of the cell of rank 1. In other words, the signal of frequency $FI_i$ whose frequency is successively divided is propagated from the cell of rank zero to the cell of rank (p−1), whereas the swallow enable signal whose frequency is successively multiplied is propagated in the opposite direction from the cell of rank (p—1) to the cell or rank zero.

Even though the overall configuration of dividing cells shown in FIG. 1 is similar to that disclosed in the cited document FR-A-2 653 617, its operation in accordance with the present invention is different as will be described hereinafter with reference to FIG. 2.

Figure 2:
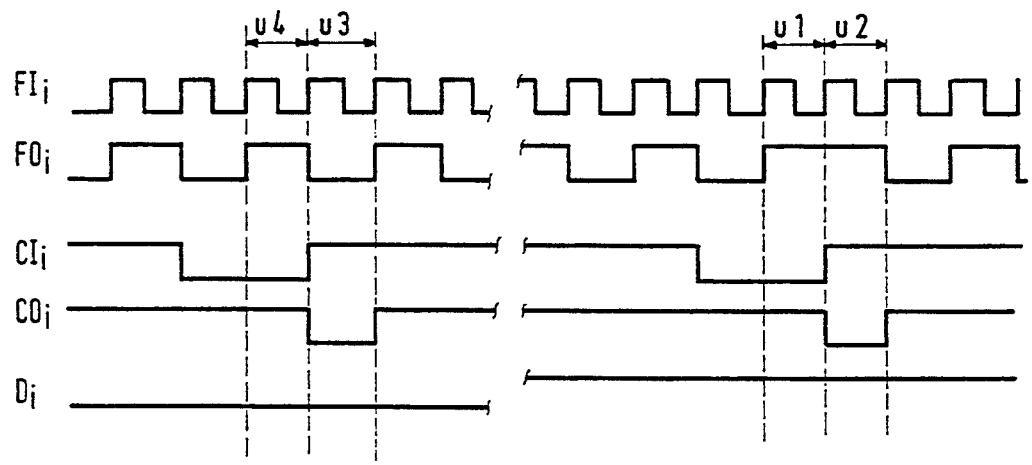
FIG. 2 shows a timing diagram relating to the part of the circuit of FIG. 1 operating in accordance with the invention.

The signal timing diagram of FIG. 2 illustrates the situation for an arbitrary cell of rank i under the assumption of a nominal division by 2 ($D_i=0$) or a division by 3 in the programmed mode ($D_i=1$). For $D_i=0$ (left-hand part of the diagram), $FO_i$ results from a division by two of the signal $FI_i$, even in the presence of a swallow enable signal ($CI_i=0$). On the other hand, for $D_i=1$ (right-hand part of the diagram), the presence of a swallow enable signal ($CI_i=0$) has the effect that $FO_i$ remains high for a supplementary interval equal to one period of the frequency $FI_i$, corresponding to a division by three of the input frequency $FI_i$. The gating signal $CO_i$, being active in the low state, appears after termination of the signal $CI_i$ and has a duration equal to half of the latter signal. It is provided to correspond substantially to the period of the frequency $FI_{i-1}$ of the cell of rank (i—1) if the duration of the signal $CI_i$ itself was approximately equal to the period of the frequency $FI_i$ of the cell of rank i.

It appears from the right-hand part of the timing diagram of FIG. 2 that the period u2 of the input frequency $FI_i$ which succeeds the period u1 of the same input frequency has been "swallowed" by the cell because during the period u1 an enable signal $CI_i$ (being active in the low state) and a programming signal $D_i$ (active during the high state) are simultaneously present. However, from the left-hand part of the same timing diagram it appears that the period u3 of the input frequency $FI_i$ is not swallowed because the programming signal $D_i$ is low during the preceding period u4.

Figure 3:
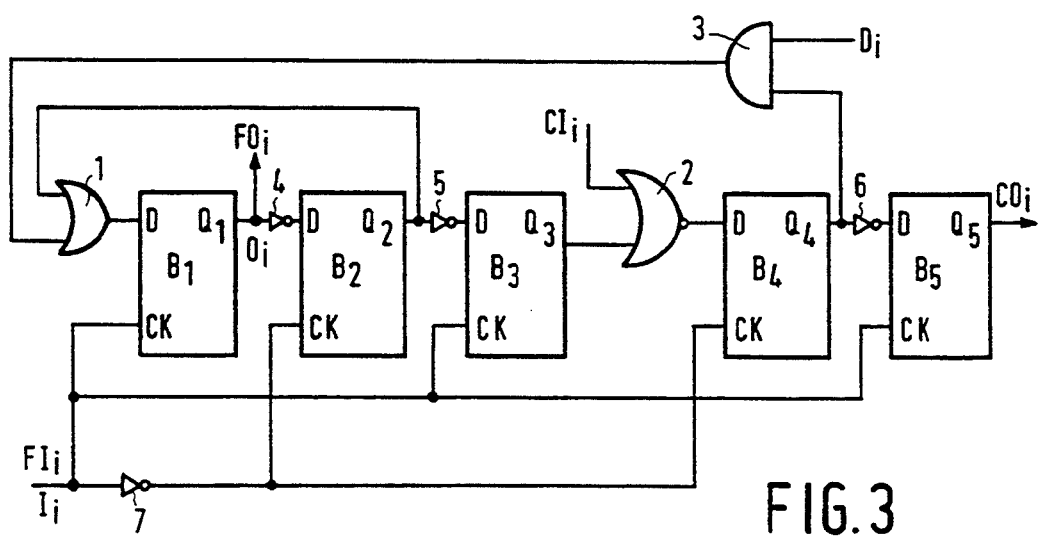
FIG. 3 shows an embodiment in accordance with the invention of a cell of the prescaler of FIG. 2, FIGS. 4a and 4b show corresponding timing diagrams.

FIG. 3 diagrammatically shows an embodiment of one of the cells shown in FIG. 1 and capable of performing the functions described by way of the timing diagram of FIG. 2. The divide-by-two function is realized by way of two cascade-connected D-type flipflops $B_1$ and $B_2$. The clock input CK of $B_1$ constitutes the input $I_i$ of the cell $C_i$ and receives the signal of frequency $FI_i$ supplied by the output $O_{i-1}$ of the cell (not shown in the Figure) of directly lower rank ($C_{i-1}$). The clock input CK of the second flipflop $B_2$ receives the logic inverse of the signal of frequency $FI_i$ (via the inverter 7). The output $Q_1$ of the first flipflop $B_1$ is applied, after inversion by an inverter 4, to the data input D of the second flipflop $B_2$ whose output $Q_2$ is fed back to the input D of the first flipflop $B_1$ via an OR-gate 1. The output $Q_1$ of the first flipflop constitutes the first output $O_i$ of the cell. The cell $C_i$ also comprises a hold stage between the output $Q_2$ of the second flipflop $B_2$ and the data input D of the first flipflop $B_1$, said stage including said programming input $D_i$ of the relevant cell and also being operative to impose the state of the data input D of the first flipflop $B_1$ for a swallowing operation when the swallow programming signal $D_i$ and the enable signal $CI_i$ are simultaneously active.

More specifically, said hold stage comprises a third D-type flipflop $B_3$ which is clocked by the signal of input frequency $FI_i$ and whose data input D receives the logic inverse of the output signal $Q_2$ of the second flipflop $B_2$ (inverter 5) and whose output is applied to an inverting OR-gate 2, the second input of which constitutes said second input $CI_i$ of the cell which is referred to as the swallow enable input. The output of said OR-gate 2 is connected to the data input D of a fourth D-type flipflop $B_4$ which is clocked by the inverse of the signal of input frequency $FI_i$ and whose output $Q_4$ is fed back to the input D of the first flipflop $B_1$ because this output is connected to an input of an AND-gate 3, the other input of which constitutes said programming input $D_i$ of the cell, and also because of the fact that the output of the AND-gate 3 is connected to one of the inputs of the OR-gate 1, the other input of which receives the output signal $Q_2$ of the second flipflop $B_2$ and realizes said feedback from said output $Q_2$ to the input of the first flipflop $B_1$.

In order to produce the gating signal intended for the cell $C_{i-1}$ of directly lower rank, the cell $C_i$ also comprises a fifth D-type flipflop $B_5$ which is clocked by the signal of input frequency $FI_i$, whose data input D receives the logic inverse of the output $Q_4$ (inverter 6) of the fourth flipflop $B_4$ and whose output $Q_5$ constitutes said second output $CO_i$ of the cell which supplies the gating signal.

The operation of a cell will be described with reference to the timing diagram of FIG. 4a.

In the left-hand part of this timing diagram, the programming signal $D_i$ is 0 and hence blocks the AND-gate 3. In the initial state, the input D of the flipflop $B_1$ is 0 and the input D of the flipflop $B_2$ is 1. The output $Q_2$ of the flipflop $B_2$ becomes 1 in response to a falling edge of $FI_i$, this state 1 is applied to the input D of the flipflop $B_1$ via the OR-gate 1. The signal $FO_i$ on the output of the flipflop $B_1$ becomes 1 in response to the next rising edge of $FI_i$, thus causing a level 0 on the input D of the second flipflop $B_2$ whose output $Q_2$ becomes 0 in response to the next falling edge of $FI_i$. This change of state itself produces a 0 on the input D of the first flipflop $B_1$ which again becomes 1 in response to the next rising edge of $FI_i$, and so on.

It appears thus far that the output signal $FO_i$ corresponds very well to a frequency amounting to half the input frequency $FI_i$ and it will now be demonstrated that the same takes place when the programming input $D_i$ is low.

The output signal $Q_3$ of the third flipflop $B_3$ is shifted one half period with respect to the frequency of the signal $FO_i$ because of the combined effect of the inverter 5 and the clock frequency $FI_i$ applied to the clock input CK of the flipflop $B_3$. Generally speaking, the enable signal $CI_i$ is 1, that is to say in the absence of reception of the gating signal supplied by the subsequent cell. In this general case, the input D of the fourth flipflop $B_4$ is zero because of the OR-gate 2 and its output $Q_4$ also remains zero. When an enable signal appears, being active in the low state, $CI_i$ becomes 0 and the output $Q_4$ becomes 1 in response to the first falling edge of the input frequency $FI_i$ which follows the transition of the output $Q_3$ of the flipflop $B_3$ to the level 0. $Q_4$ becomes 0 again in response to the first falling edge of the frequency $FI_i$ which succeeds the transition of the enable signal $CI_i$ to the state 1.

The gating signal $CO_i$ supplied by the output $Q_5$ of the fifth flipflop $B_5$, normally being 1, changes over to the state 0 in response to the first rising edge of the frequency $FI_i$ which follows the transition to the state 1 of the output $Q_4$ of the flipflop $B_4$. It becomes 1 again in response to the first rising edge of the frequency $FI_i$ which follows the transition to the level 0 of the output $Q_4$ of the flipflop $B_4$; this is due to the presence of the inverter 6 and the clock frequency applied to the clock input CK of the flipflop $B_5$. A gating signal $CO_i$, being active in the low state, is thus formed immediately after the enable signal $CI_i$ whose duration is equal to the period of the input frequency $FI_i$ of the cell.

Because the programming input $D_i$ is low in the left-hand part of FIG. 4a, the hold loop $B_4$, 3,1 is not active but blocked by the AND-gate 3.

The right-hand part of the timing diagram of FIG. 4a illustrates the case where the programming command $D_i$ is activated at the high level for the purpose of swallowing of a period of the input frequency $FI_i$ of the cell. It follows that the high level of the output $Q_4$ of the fourth flipflop $B_4$ is fed back to the input of the first flipflop $B_1$ under the influence of the AND-gate 3. The hold loop is now in the active state and during the next rising edge of the input frequency $FI_i$ (instant $t_3$) the first flipflop $B_1$ does not change its state and its output $FO_i$ remains high. However, the output $Q_4$ of the fourth flipflop $B_4$ becomes low again in response to the falling edge of the frequency $FI_i$ which directly follows the instant $t_3$, i.e. at the instant $t_4$. The output signal $FO_i$ can thus become low again in response to the rising edge $FI_i$ which immediately follows $t_4$, that is to say at the instant $t_5$. It appears that the output signal $FO_i$ has thus skipped a period during a time interval which is equal to one period of the input signal $FI_i$, corresponding at that instant to a division by three instead of a division by two, so a division by $2+D_i$ ($D_i$ being either 1 or 0). It is to be noted that this operation, referred to as the swallowing of a period of the input frequency of a cell, is passed on to the signals of the output $Q_2$ of the second flipflop $B_2$ and to the output $Q_3$ of the third flipflop $B_3$. However, the signals $Q_4$ of the fourth flipflop $B_4$ and $CO_i$ on the output of the fifth flipflop $B_5$ remain the same as in the foregoing case, corresponding to the left-hand part of the timing diagram for which $D_i=0$. The gating signal $CO_i$ is thus generated in all cases.

These considerations enable determination of the timing conditions to be satisfied by the swallow enable signal $CI_i$ applied to the cell so as to achieve the skipping of an interval corresponding to a period of the input frequency $FI_i$ or the swallowing of a period which punctually induces a division by three of said frequency $FI_i$ instead of a division by two. In this respect reference is made to the timing diagram of FIG. 4b.

Actually, it is to be noted that the diagram shown in FIG. 3 is merely an example of a feasible organization of a programmable cell in accordance with the invention. Other, equivalent means could be utilized for as long as they provide the same result.

For clarity of the timing diagram of FIG. 4b, it shows only the signals $FI_i$, $FO_i$ and $CI_i$. The output signal $FO_i$ is high between the instant $t'_1$ and the instant $t'_3$ ($t_1$, $t_3$) during a period of the input signal $FI_i$. When the programming input $D_i$ is activated at the high level in order to program a swallowing operation, the high state of the output signal $FO_i$ is prolonged until the instant $t_5$, so during a supplementary period of the input signal $FI_i$. The output signal $Q_4$ of the fourth flipflop $B_4$ enables a swallowing operation by maintaining a level 1 on the input D of the first flipflop $B_1$ in the presence of a rising edge of the input frequency $FI_i$ (at the instant $t_3$). Thus, the signal of the output $Q_4$ of the flipflop $B_4$ becomes high in response to the falling edge of the signal $FO_i$ when the signal $Q_3$ and the signal $CI_i$ are both 0. Thus, the signal $CI_i$ should already be 0 upon the falling edge of the input frequency $FI_i$ at the instant $t_2$ preceding the instant $t_3$. In practice, therefore, the signal $CI_i$ must become 0 a half period of $FI_i$ before the instant $t_2$, i.e. at the instant $t_1$. On the other hand, in order to achieve a swallowing operation definitely by way of a rise to the level 1 of the output $Q_4$ of the fourth flipflop $B_4$, it is necessary that the signal $CI_i$ is still low for one half period of $FI_i$ beyond the instant $t_2$, that is to say until the instant $t_3$. In other words, the swallowing operation occurs at the instant $t_3$ subsequent to the changing of state of the flipflop $B_4$ which should already be effective at the instant $t_2$. The minimum duration from $t_1$ to $t_3$ of the signal $CI_i$ in the state 0 enabling the swallowing of a period of $FI_i$ and being denoted by thinner lines in FIG. 4b corresponds to a half period of $FI_i$ to both sides of the instant $t_2$.

The maximum duration of the swallow enable signal $CI_i$ extends a period of $FI_i$ to both sides of the minimum duration and hence from the instant $t_0$ to the instant $t_5$. Actually, if the signal $CI_i$ were still 0 beyond the instant $t_5$, the output $Q_4$ of the fourth flipflop $B_4$ could become 1 again a half period of the frequency $FI_i$ after the instant $t_5$, thus causing a further skipping of an interval in the case where the signal $D_i$ is again programmed to the level 1. However, if the signal $CI_i$ were already 0 at the falling edge of the frequency $Ft_i$ preceding the instant $t_0$, so a period and a half of the frequency $FI_i$ before $t_1$, the output $Q_4$ of the fourth flipflop $B_4$ might become 1, thus causing premature and supplementary swallowing.

It appears from the foregoing analysis that the enable signal $CI_i$ has a duration of between 1 and 3 times the period of the input frequency $FI_i$ of the cell $C_i$. Thus, the swallow enable signal $CI_i$ is none other than the signal which is referred to as the gating signal and which is supplied by the cell succeeding the cell $C_i$, that is to say the cell having the index $i+1$. Thus, the cell $C_{i+1}$ has an input frequency $FI_{i+1}$ which amounts to half the frequency $VI_i$, with the result that the gating signal $CO_i$ generated by the cell of rank i should have a duration amounting to half of that defined for its own enable signal $CI_i$. In practice there is the condition that the gating signal generated by a cell of rank i should have a duration of between 0.5 and 1.5 times the period of the input frequency $FI_i$ of the relevant cell. It can now be found that the conditions concerning the duration of the enable signal $CI_i$ are less strict than in the prior art.

The FIGS. 5 and 6 relate to the operation of three adjacent cells $C_{i-1}$, $C_i$ and $C_{i+1}$ of the type described with reference to FIG. 3. FIG. 5 shows the connections between the three said cells and FIG. 6 shows a timing diagram for the signals FI and CI of said cells. In the absence of a swallowing operation, the signal of input frequency $FI_i$ of the cell $C_i$ has a frequency amounting to half of that of the signal of input frequency $FI_{i-1}$. Similarly the input signal $FI_{i+1}$ has a frequency which amounts to half of that of the input signal $FI_i$.

The enable signal $CI_i$ of the cell $C_i$, being active in the low state, has a duration which amounts to twice that of the period of the signal of input frequency $FI_i$ of the relevant cell $C_i$ and it commences a period of $FI_i$ before the start of the minimum window indicated by a heavy stroke. The enable signal $CI_{i-1}$ applied to the cell $C_{i-1}$ (which is none other than the gating signal $CO_i$ supplied by the cell $C_i$) has an active duration in the low state which is equal to two periods of the input frequency $FI_{i-1}$ of the cell $C_{i-1}$. Actually, FIG. 4a shows that the enable signal $CI_{i-1}$ has a duration amounting to half of that of the enable signal $CI_i$ of the cell $C_i$. Ultimately the input signals $FI_{i-1}$, $FI_i$, $FI_{i+1}$ are generated at a frequency which is successively lower, whilst the enable signals, successively generated in the reverse order $CI_{i+1}$, $CI_i$ and $CI_{i-1}$, have a progressively higher frequency. However, an arbitrary cell always exhibits the same ratio (in this case a ratio 2) of the period of its enable signal $CI_i$ to that of its input frequency $FI_i$.

Figure 7:
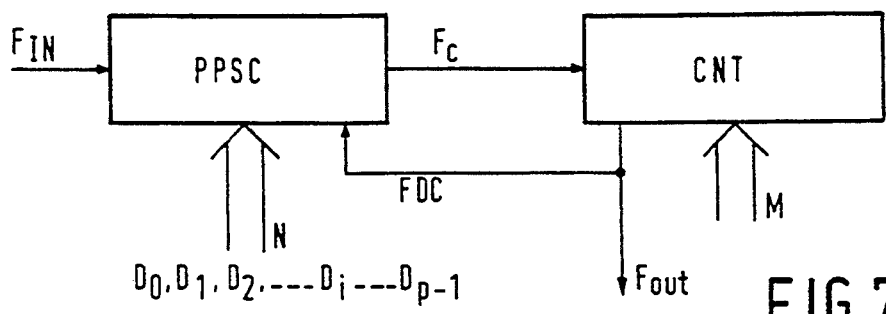
FIG. 7 shows a frequency divider circuit in accordance with the invention.

FIG. 7 shows diagrammatically a frequency divider circuit in accordance with the invention. It utilizes a prescaler PPSC as described above which is associated with a counter CNT. The prescaler PPSC corresponds to the circuit described with reference to FIG. 1. It receives an input frequency $F_{IN}$ to be divided and produces an output signal $F_c$ which is applied to the countdown input of the counter CNT. The counter CNT is loaded with a total count M and operates cyclically (M=an integer variable greater than 1). The counter CNT produces an end of cycle signal FDC which is applied to the enable input $CI_{p-1}$ of the $p^{th}$ cell, i.e. the output cell of the prescaler, of rank (p−1). The set of programming signals $(D_{p-1} \ldots D_i \ldots D_1, D_o)$ forms a binary number of the value N:

$$N = D_o + 2D_1 + 2^2 D_2 + \ldots 2^i D_i + \ldots + 2^{p-1} D_{p-1} \quad (1)$$

When the signal FDC becomes 0, the prescaler PPSC changes over to the programming mode and the enable signal $CI_i$ and the gating signal $CO_i$ traverse the cells in the opposite direction as described above while inducing a single swallowing of a period of $F_i$ in each of the cells for which $D_i$ is 1.

When the end of cycle signal FDC is high (equal to 1), the division factor of the prescaler PPSC equals $2^p$, because it comprises p cells for division by 2. When the end of cycle signal FDC, however, is low (0), the prescaler PPSC changes over to the programming mode. The following calculations enable determination of the number of periods of the input frequency $F_{IN}$ of the prescaler PPSC necessary to form a complete output period of the signal $F_c$ on the output of the prescaler PPSC. In order to obtain a period of the output signal FC of the prescaler, there are required:

at the input of the cell of rank p−1: $2 + D_{p-1}$ periods;
at the input of the cell of rank p−2: $2(2+D_{p-1}) + D_{p-2}$ periods;
at the input of the cell of rank p−3: $2(2+(2+D_{p-1})+D_{p-2})+D_{p-3}$ periods, so $2^2(2+D_{p-1}) + 2 D_{p-2} + D_{p-3}$ periods;
at the input of the cell of rank p−4: $2^3(2+D_{p-1}) + 2^2 D_{p-2} + 2 D_{p-3} + D_{p-4}$ periods, ...
and at the input of the cell of rank 0
that is to say at the input of the prescaler PPSC: $2^{p-1}(2+D_{p-1}) + 2^{p-2}D_{p-2} + \ldots + 2D_1 + D_o$ periods,
which can be written as: $2^p + (2^{p-1}D_{p-1} + 2^{p-2}D_{p-2} + \ldots + 2D_1 + D_o)$
so, taking into acount the relation (1):

$$2^p + N \quad (2)$$

For the prescaler assembly PPSC a cycle in the programming mode thus corresponds to a swallowing of N times the period of $F_{IN}$. The operation of the frequency divider circuit shown in FIG. 7 is then as follows:

Initially, the counter CNT is loaded to the count M and the signal FDC is 1. The prescaler PPSC thus divides in a non-programmed mode where all cells have a division factor 2. This continues during (M−1) periods of the output signal $F_c$ of the prescaler until the counter CNT reaches the count 0. At that instant, the end of cycle signal FDC becomes 0, thus activating the prescaler PPSC in the programming mode, and validates the programming inputs $D_o, \ldots D_i \ldots D_{p-1}$. As from that instant, the counter CNT may be reloaded with the count M which may be equal to or different from the preceding count M. As will be seen, a period of time equal to the period of the output frequency $F_c$ of the prescaler PPSC (in the programmed mode) is available for carrying out this operation.

During the first (M−1) period of the output signal $F_{DC}$ of the prescaler a division of the input frequency $F_{IN}$ by $2^p$ is obtained, corresponding to $(M-1) 2^p$ clock periods $F_{IN}$.

During the remaining period ($M^{th}$ period) the programmed mode of the prescaler PPSC provides a division by $2^p + N$, corresponding to $2^p + N$ periods of the clock frequency $F_{IN}$.

Thus, on the output $F_{OUT}$ of the frequency divider circuit there is obtained a complete period which corresponds to:

$(M-1)2^p + 2^p + N$, so $M 2^p + N$ periods of the input frequency $F_{IN}$.

The division factor R thus becomes:
$R = M 2^p + N$.

Figure 8:
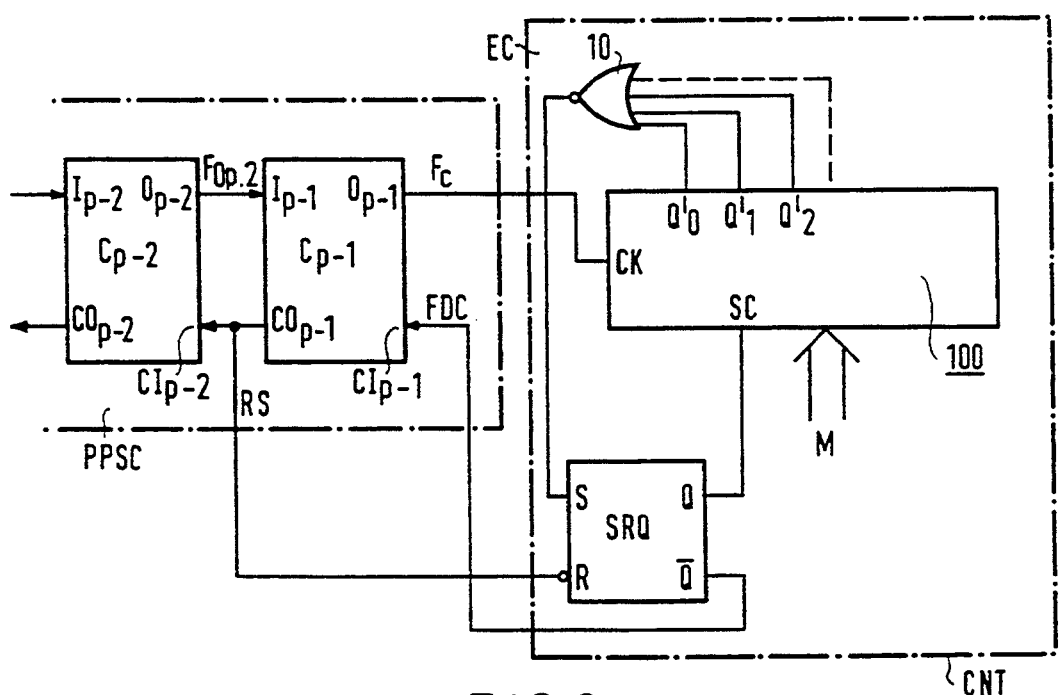
FIG. 8 shows an embodiment of counting means connected to the output part of the prescaler of FIG. 1.
Figure 9:
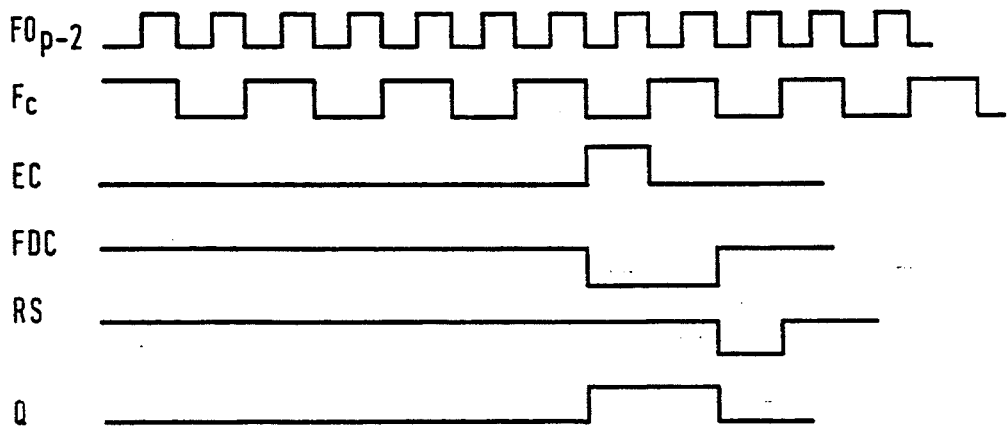
FIG. 9 shows a corresponding timing diagram.

FIG. 8 allows for a more detailed description of the control of the coupling between the counter CNT and the output of the prescaler PPSC, and FIG. 10 shows a timing diagram for the corresponding signals. For ease of understanding, the counter CNT is shown to have three parts: an inverting OR-gate 10, a count-down device which is denoted by the reference 100, and a flipflop SRQ of the SR type. The count-down device 100 comprises a clock input CK, an input for storing the number M to be counted down, an enable input SC for the loading of the count M, and bit-by-bit outputs $Q'_o$, $Q'_1$, $Q'_2 \ldots$ which are connected in parallel to the inputs of the OR-gate 10. The non-inverting output Q of the flipflop SRQ is connected to the enable input SC of the count-down device 100, the inverting output $\overline{Q}$ of said flipflop being connected to the input $CI_{p-1}$ as the end of cycle signal FDC, the input S of the flipflop SRQ is connected to the inverting output of the OR-gate 10, and the inverting input of the flipflop SRQ is connected to the connection $CO_{p-1}$, $CI_{p-2}$ which supplies the reset signal RS for the flipflop SRQ. When the count M has been counted down to zero, all outputs $Q'_o$, $Q'_1$, $Q'_2$ ... are zero, thus supplying the output of the inverting OR-gate 10 with a signal EC having the state 1, enabling, via the flipflop SRQ, the loading of the count M and subsequently at least one of the outputs Q' of the count-down device 100 becomes 1 so that the output signal of the OR-gate 10 becomes zero again. At the same instant said flipflop SRQ applies an inverted output signal $\overline{Q}$ as well as an end of cycle signal FDC to the input $CI_{p-1}$ of the prescaler PPSC. The output cell of rank (p−1) of the prescaler PPSC will generate a gating signal in the described manner. This signal is used as a reset signal RS which is applied to an inverting input R of the flipflop SRQ which induces a change of state of the signal SC (low state), thus unblocking the loading of the count M and making the count-down device 100 enter the count-down mode again. In conformity with the example shown in FIG. 6, the signal RS has a duration amounting to half of that of the end of cycle signal FDC.

It is to be noted that it is not necessary to use the output cell $C_{p-1}$ for generating the signal RS. It could also be produced on the basis of a monostable circuit (not shown) which would use at its input the rising edge of the output signal $\overline{Q}$ of the flipflop SRQ and which would produce a pulse RS of a duration substantially equal to half the duration of the end of cycle signal FDC.

For a suitable understanding of the advantages offered by the frequency divider circuit in accordance with the invention it is to be noted that all connections between the counter CNT and the prescaler PPSC operate at frequencies which are the lowest and which correspond to the output frequency $F_c$ of the prescaler PPSC. It is also to be noted that the end of cycle signal FDC may be generated, generally speaking, at any instant during a counting cycle. The propagation in the opposite direction of the swallow enable signal may even span two periods of the count-down cycle of M, subject to the condition that the end of cycle signal FDC must always be produced at the same instant within this count-down cycle and only once per cycle.

A frequency divider circuit in accordance with the invention can be advantageously used in a frequency synthesizer, especially for transforming the output of an oscillator, controlled by a voltage (VCO) of a frequency in the order of magnitude of 1 GHz, into a signal of comparatively low frequency by division by a factor R which is variable in steps of one unit, compared with a stable frequency supplied by a quartz oscillator. The variation of the factor R enables selection of different receiving channels.

I claim:

1. A programmable frequency divider circuit, comprising:

cascade-connected frequency dividing cells, a cell of rank i in the cascade performing an $i^{th}$ division, where i takes a value from 0 to (p−1), all cells being switchable between a normal divide-by-two mode and a programmed divide-by-three mode, a cell of arbitrary rank i comprising a first input ($I_i$) for an input frequency signal ($FI_i$) and a first output ($O_i$) for an output frequency signal ($FO_i$) to be applied to the first input ($I_{i+1}$) of the next cell of rank (i+1), a second input ($CI_i$) for an enable signal for the programmed mode, a third input ($D_i$) for a programming signal, and a second output ($CO_i$) for a gating signal, and means for generating said gating signal from the enable signal received on the second input ($CI_i$) of the cell i, said gating signal being applied to the second input ($CI_{i-1}$) of the cell (i−1) of lower rank as an enable signal, characterized in that the means for generating the gating signal are operative so that this signal is supplied from the instant at which the enable signal received by the relevant cell i returns to its inactive logic state, in that with the p cells which constitute a prescaler for the frequency divider circuit there are associated counting means for forming a first counting operation and a second counting operation for a first number and a second number, respectively, of periods of the output frequency of said prescaler, the second input ($CI_{p-1}$) of the $p^{th}$ cell receiving an enable signal which is supplied by the counting means and which is derived from the completion of said first counting operation, the completion of said first and second counting operations constituting an output period of the divider circuit.

2. A divider circuit as claimed in claim 1, characterized in that when said counting means are loaded with a total count M (where M is an integer variable greater than 1) said first number is equal to (M−1), and in that during the counting of said first number the p cells of the prescaler operate in the non-programmed mode and the programming inputs ($D_i$) are reloadable while said second number is equal to 1, corresponding to a period of the output frequency of the prescaler whose cells then operate in the programmed mode, said counting means being reloaded to the count M during the latter period.

3. A divider circuit as claimed in claim 1, characterized in that the gating signal generated by a cell of rank i has a duration of between 0.5 and 1.5 times the period of the input frequency ($FI_i$) of the relevant cell.

4. A divider circuit as claimed in claim 3, characterized in that each of the cells of the prescaler comprises a first D-type flipflop and a second D-type flipflop, which flipflops are cascade-connected and are clocked by the input frequency signal ($FI_i$) of the relevant cell and its logic inverse, respectively, in that the output of the second flipflop is fed back to the data input of the first flipflop, the output of the first flipflop constituting the first output of the cell, and in that said divider circuit comprises a hold stage between the output of the second flipflop and the data input of the first flipflop, which hold stage includes said programming input ($D_i$) of the cell and is operative to impose the state of the data input (D) of the first flipflop ($B_1$) for swallowing a period of the input frequency signal ($FI_i$) when the programming signal ($D_i$) and the enable signal ($CI_i$) are simultaneously active.

5. A divider circuit as claimed in claim 4, characterized in that the hold stage comprises a third D-type flipflop which is clocked by the input frequency signal ($FI_i$) and whose data input receives the logic inverse of the output signal of the second flipflop, its output being connected to a first inverting OR-gate, the second input of said OR-gate constituting said second input ($CI_i$) of the cell, the output of said OR-gate being connected to the data input of a fourth D-type flipflop which is clocked by the inverse of the input frequency signal ($FI_i$) and whose output is fed back to the data input of the first flip flop because this output is connected to a first input of an AND-gate whose other input constitutes said programming input ($D_i$) of the cell, the output of the AND-gate being connected to a first input of a second OR-gate whose output is connected to the data input of the first flipflop, the second input of the second OR-gate receiving the output signal of the second flipflop in order to realize said feedback from said output to the input of the first flipflop.

6. A divider circuit as claimed in claim 5, characterized in that each cell of the prescaler also comprises a fifth D-type flipflop which is clocked by the input frequency signal ($FI_i$) and whose data input receives the logic inverse of the output of the fourth flipflop, the output of the fifth flipflop constituting said second output ($CO_i$) of the cell.

7. A divider circuit as claimed in claim 1, characterized in that said counting means are formed by a cyclical counter (CNT) having a countdown input which is connected to the output ($O_{p-1}$) of the $p^{th}$ cell of the prescaler, and a count-down output which activates the enable input ($CI_{p-1}$) of the $p^{th}$ cell of the prescaler when said count-down reaches zero.

* * * * *